(12) United States Patent
Arai et al.

(10) Patent No.: US 8,772,822 B2
(45) Date of Patent: Jul. 8, 2014

(54) LIGHT EMITTING DEVICE

(71) Applicant: Shinko Electric Industries Co., Ltd., Nagano (JP)

(72) Inventors: Rie Arai, Nagano (JP); Akinori Shiraishi, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 13/723,845

(22) Filed: Dec. 21, 2012

(65) Prior Publication Data
US 2013/0163632 A1 Jun. 27, 2013

(30) Foreign Application Priority Data
Dec. 27, 2011 (JP) .................................. 2011-286756
Nov. 26, 2012 (JP) .................................. 2012-257836

(51) Int. Cl.
H01L 33/00 (2010.01)

(52) U.S. Cl.
USPC ............................................ 257/99; 257/433

(58) Field of Classification Search
USPC ............ 257/99, 433, 684, E33.058, E23.104; 438/116
See application file for complete search history.

(56) References Cited

U.S. PATENT DOCUMENTS

| 7,900,579 | B2 * | 3/2011 | Inoue et al. | 118/641 |
| 2008/0264343 | A1 * | 10/2008 | Hagihara | 118/728 |
| 2011/0244396 | A1 * | 10/2011 | Aoki | 430/319 |
| 2012/0305033 | A1 * | 12/2012 | Keigler et al. | 134/94.1 |
| 2012/0329291 | A1 * | 12/2012 | Inoue et al. | 438/795 |
| 2013/0292254 | A1 * | 11/2013 | Kumar et al. | 205/81 |
| 2013/0321893 | A1 * | 12/2013 | McCabe et al. | 359/265 |

FOREIGN PATENT DOCUMENTS

| JP | 2001-339122 | 12/2001 |
| JP | 2009-524223 | 6/2009 |

* cited by examiner

Primary Examiner — Jarrett Stark
Assistant Examiner — Shahed Ahmed
(74) Attorney, Agent, or Firm — Rankin, Hill & Clark LLP

(57) ABSTRACT

A light emitting device includes: a first light emitting element mounting unit including: a first substrate; a first light emitting element on a first surface of the first substrate; and a first substrate holder which includes a first column, and a first protrusion which extends from the first column toward the first light emitting element and bonded to the first surface of the first substrate; and a second light emitting element mounting unit including: a second substrate; a second light emitting element mounted on a first surface of the second substrate; and a second substrate holder which includes: a second column, and a second protrusion which extends from the second column toward the second light emitting element and bonded to the first surface of the second substrate. The second light emitting element mounting unit is stacked on the first light emitting element mounting unit.

9 Claims, 23 Drawing Sheets

LIGHT EMITTING DEVICE

This application claims priority from Japanese Patent Application Nos. 2011-286756, filed on Dec. 27, 2011 and 2012-257836, filed on Nov. 26, 2012, the entire contents of which are herein incorporated by reference.

BACKGROUND

1. Technical Field

Embodiments described herein relates to a light emitting device having a plurality of light emitting elements.

2. Related Art

In recent years, a light emitting device has become known in which a plurality of light emitting elements held by a holding member are stacked so as to emit a plurality of light beams. As such a light emitting element, for example, a semiconductor laser diode has been used, and as such a holding member, for example, a copper-tungsten (CuW) substrate has been used. Since such a light emitting device has a structure in which copper-tungsten (CuW) substrates that are holding members and light emitting elements are alternately stacked, the thickness of the copper-tungsten (CuW) substrates becomes a factor for the pitch of the light emitting elements (see e.g., JP-A-2001-339122 and JP-A-2009-524223).

However, since such a copper-tungsten (CuW) substrate is difficult to make thinner, and the thickness accuracy becomes poor when the substrate is thinned, it has been difficult to stack light emitting elements with a narrow or high pitch accurately.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

It is one of illustrative aspects of the present invention to provide a light emitting device in which light emitting elements can be stacked with a narrow or high pitch accurately.

According to one or more illustrative aspects of the present invention, there is provided a light emitting device. The light emitting device comprises a first light emitting element mounting unit comprising: a first substrate made of a conductive material and comprising a first surface and a second surface opposite to the first surface; a first light emitting element configured to emit light and mounted on the first surface of the first substrate; and a first substrate holder which supports the first substrate and comprises: a first column which faces a side surface of the first substrate and extends in a thickness direction of the first light emitting element and the first substrate; and a first protrusion which extends from the first column toward the first light emitting element and which is bonded to the first surface of the first substrate; a second light emitting element mounting unit comprising: a second substrate made of a conductive material and comprising a first surface and a second surface opposite to the first surface; a second light emitting element configured to emit light and mounted on the first surface of the second substrate; and a second substrate holder which supports the second substrate and comprises: a second column which faces a side surface of the second substrate and extends in a thickness direction of the second light emitting element and the second substrate; and a second protrusion which extends from the second column toward the second light emitting element and which is bonded to the first surface of the second substrate. The second light emitting element mounting unit is stacked on the first light emitting element mounting unit such that the second column of the second substrate holder is bonded to the first column of the first substrate holder and the first light emitting element is bonded to the second surface of the second substrate via a first bonding material.

According to one or more illustrative aspects of the present invention, there is provided a light emitting device. The light emitting device comprises: a first substrate made of a conductive material and comprising a first surface and a second surface opposite to the first surface; a first light emitting element configured to emit light and mounted on the first surface of the first substrate; a second substrate made of a conductive material and comprising a first surface and a second surface opposite to the first surface; a second light emitting element configured to emit light and mounted on the first surface of the second substrate; a substrate holder which supports the first and second substrates and made of a plate-like member, the substrate holder comprising: a first through hole, wherein the first substrate is inserted into the first through hole and bonded to an inner wall of the first through hole; and a second through hole, wherein the second substrate is inserted into the second through hole and bonded to an inner wall of the second through hole. The first light emitting element is bonded to the second surface of the second substrate via a bonding material.

According to one or more illustrative aspects of the present invention, there is provided a light emitting device. The light emitting device comprises: a first substrate made of a conductive material and comprising a first surface and a second surface opposite to the first surface; a first light emitting element configured to emit light and mounted on the first surface of the first substrate; a second substrate made of a conductive material and comprising a first surface and a second surface opposite to the first surface; a second light emitting element configured to emit light and mounted on the first surface of the second substrate; a substrate holder which supports the first and second substrates and made of a plate-like member, the substrate holder comprising: a first groove, wherein the first substrate is inserted into the first groove and bonded to an inner wall of the first groove; and a second groove, wherein the second substrate is inserted into the second groove and bonded to an inner wall of the second groove. The first light emitting element is bonded to the second surface of the second substrate via a first bonding material.

Other aspects and advantages of the present invention will be apparent from the following description, the drawings and the claims.

DETAILED DESCRIPTION OF EXEMPLARY EMBODIMENTS

Figure 1A:
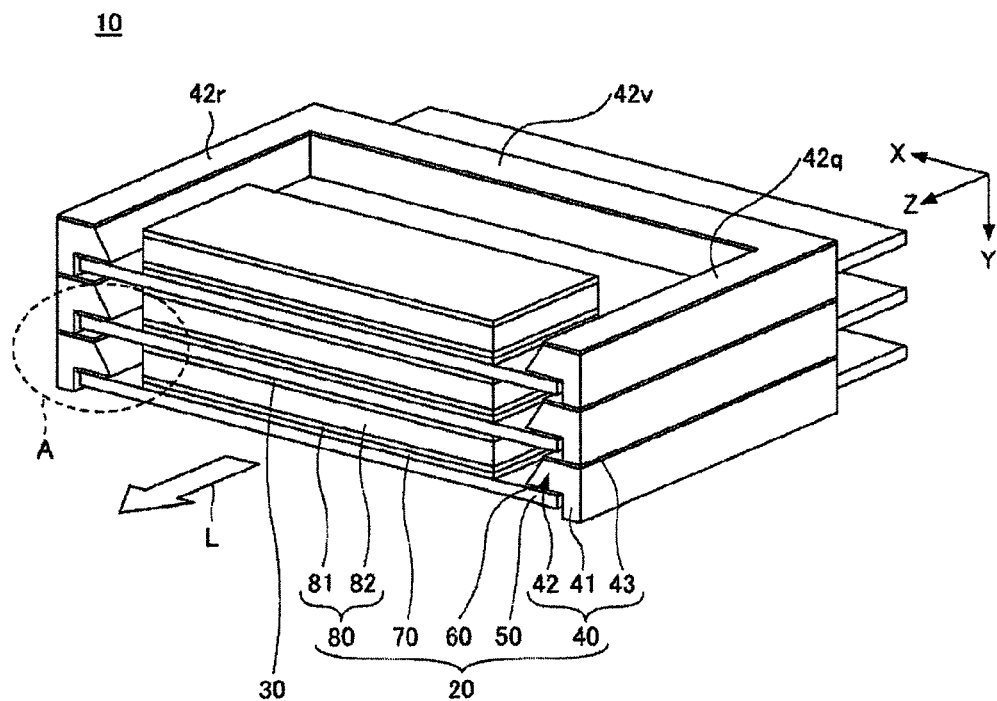
FIGS. 1A and 1B are diagrams illustrating a light emitting device according to a first embodiment.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

First Embodiment

Figure 1B:
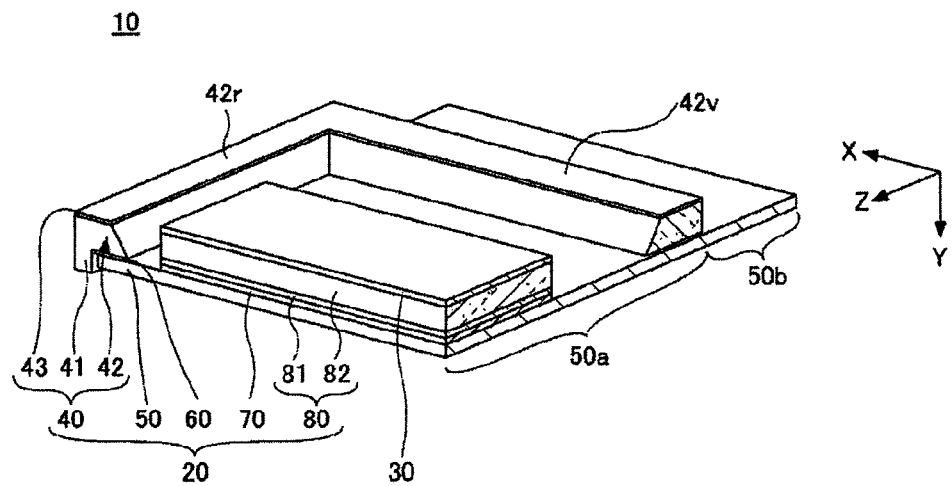
Figure 2:
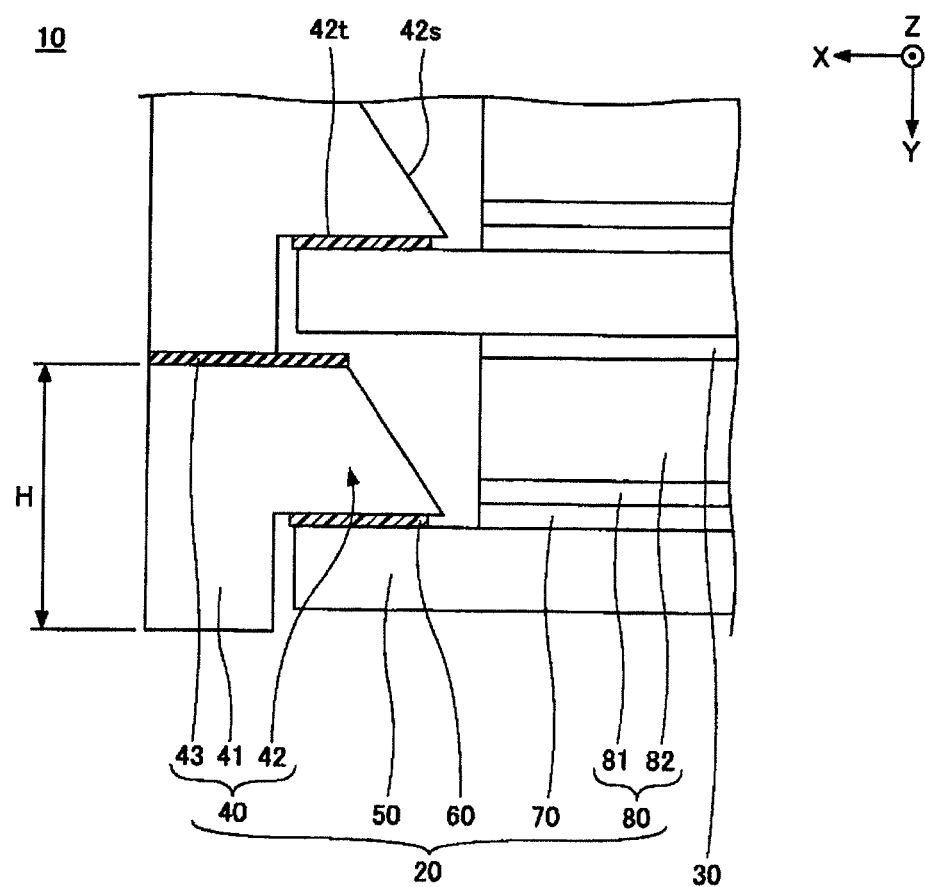
FIG. 2 is a front view illustrating a portion A of FIG. 1 in an enlarged manner.

First, the structure of a light emitting device according to a first embodiment will be described. FIGS. 1A and 1B are diagrams illustrating the light emitting device according to the first embodiment. FIG. 1A is a perspective view and FIG. 1B is a cross-sectional perspective view showing a part of FIG. 1A. FIG. 2 is a front view illustrating a portion A of FIG. 1 in an enlarged manner (a side from which emission light L is emitted is set to be the front side). FIG. 2 is a front view, however for the sake of convenience, there is a portion that undergoes hunting corresponding to FIG. 4 (cross-sectional view) to be described later (the same is applied also to FIGS. 16 and 21 to be described below).

In FIGS. 1A, 1B and 2, a light emitting device 10 has been disposed so as to emit emission light L of a light emitting element 80 in the horizontal direction, but the direction in which the light emitting device 10 emits is not limited thereto. For example, the light emitting device 10 may be disposed so as to emit the emission light L of the light emitting element 80 in the vertical direction, or the light emitting device 10 may be disposed so as to emit the emission light L of the light emitting element 80 in an oblique direction. The emission direction of the emission light L is set as a Z direction in FIG. 1 and the like.

Referring to FIGS. 1A, 1B and 2, the light emitting device 10 broadly includes a plurality of light emitting element mounting units 20 and bonding materials 30. The plurality of light emitting element mounting units 20 are provided and each of the light emitting element mounting units 20 is stacked on top of each other via the bonding material 30. As a material of the bonding material 30, for example, a conductive material such as gold-tin solder, indium solder, silver paste, or the like can be used. The thickness of the bonding material 30 can be, for example, about 5 μm. In the present embodiment, three light emitting element mounting units 20 are stacked on top of each other, but two or four or more units may be stacked.

The light emitting element mounting unit 20 includes a substrate holder 40, a substrate 50, an adhesive material 60 and a bonding material 70, and the light emitting element 80. The light emitting element mounting unit 20 is configured to hold the conductive substrate 50 (in which the light emitting element 80 is provided in one surface) using the substrate holder 40 that is made of silicon, and a plurality of the light emitting element mounting units 20 are stacked on top of each other at a predetermined pitch.

The substrate holder 40 is disposed on the outside of a side face of the substrate 50. The substrate holder 40 includes a column 41 and a protrusion 42 formed integrally with the column 41. The column 41 is formed to extend in the thickness direction of the substrate 50 and the light emitting element 80. The protrusion 42 is formed to extend from one side face of the column 41 which faces the substrate 50 as shown in FIGS. 1A, 1B and 2 in a plane direction (X direction) of the substrate 50.

The substrate holder 40 in the present embodiment is formed in a hook shape in both side faces of the substrate 50 when viewed in the cross-sectional direction. The bottom face 42t of the protrusion 42 is bonded to a portion including the outer edge portion of one face of the substrate 50 via the adhesive material 60. Further, the protrusion 42 is formed integrally with one side face of the column 41.

The substrate holders 40 are bonded to each other via an insulating film 43. Especially, the upper surface of the column 41 of one of the substrate holders 40 is bonded to the lower surface of the column 41 of the other substrate holder 40 via the insulating film 43. Instead of the insulating film 43, the substrate holders may be bonded to each other via an adhesive material.

The insulating film 43 is, for example, a silicon dioxide film ($SiO_2$). The thickness of the insulating film 43 can be, for example, about 1 μm. Note that, if the protrusion 42 and the substrate 50 can be reliably insulated by using an insulating material as the adhesive material 60, the insulating film 43 may not be formed.

The substrate holder 40 is formed like a "U" shape when viewed from the top. The protrusion 42 protrudes toward, for example, the inner side of the "U" shape from one end side of the column 41. When the substrate holder 40 is formed like a "U" shape, the column 41 is disposed on the outside of both side faces of the substrate 50. Further, the protrusion 42 has outer circumferential portions 42r and 42q that face each other, and a center portion 42v that extends in the plane direction of the substrate 50 to connect the outer circumferential portions 42r and 42q.

The column 41 and the protrusion 42 are formed of the same material in an integrated manner. The height H of the column 41 defines the pitch of the light emitting element mounting portion 20 (in other words, the pitch of the light emitting element 80). Note that, in the present embodiment, an inner side face 42s of the protrusion 42 (the inner portion of the letter U) is set to be an inclined face, but is not limited to the inclined surface.

The substrate 50 is a conductive substrate on which the light emitting element 80 is to be mounted. The reason for using a conductive substrate as the substrate 50 is that, when current is made to flow in series in each light emitting element 80, the substrate 50 serves as a part of the current route, as described below. As the substrate 50, for example, a copper-tungsten (CuW) substrate can be used. The thickness of the substrate 50 can be, for example, about 100 to 400 μm. The copper-tungsten (CuW) substrate is favorable in that the thermal expansion coefficient thereof matches that of the light emitting element 80 when the light emitting element 80 to be mounted is a semiconductor laser diode. The thermal expansion coefficient of the copper-tungsten (CuW) substrate is about 6.5 to 8.5 ppm/° C.

The substrate 50 has one face and the other face opposite to the one face. On the one face of the substrate 50, the light emitting element 80 is mounted, and the bottom face 42t of the protrusion 42 of the substrate holder 40 is bonded to the one face of the substrate 50. The other face of the substrate 50 is bonded to a second face (a face of an N-type semiconductor layer 82 in FIGS. 1A and 2) of another light emitting element 80 of another adjacent light emitting element mounting portion 20 via the bonding material 30.

The substrate 50 has a light emitting element mounting region 50a in which the light emitting element mounting portion 20 is formed and a protruding portion 50b that is a region protruding from the light emitting element mounting portion 20 and extending from the light emitting element mounting region 50a. The protruding portion 50b extends in the opposite direction to the emission light L (the Z direction in FIG. 1B).

The outer circumferential portion of the one face of the substrate 50 (the portion facing the outer circumferential portions 42r and 42q of the protrusion 42) and the center portion (the portion facing the center portion 42v of the protrusion 42) are bonded to the bottom face 42t of the protrusion 42 of the substrate holder 40 via the adhesive material 60. As a material of the adhesive material 60, for example, a photosensitive adhesive agent can be used. The thickness of the adhesive material 60 can be set to, for example, about 5 μm. The photosensitive adhesive agent is favorable in that the agent can be applied with high positional accuracy by using photolithography.

The light emitting element 80 is a semiconductor laser diode, wherein light is emitted from the end surface of the light emitting element 80. The light emitting element 80 has a structure in which, for example, a P-type semiconductor layer (a first semiconductor layer) 81 and an N-type semiconductor layer (a second semiconductor layer) 82 are connected to each other by PN junction. As the semiconductor laser diode, for example, an AlGaAs laser can be used. The light emitting element 80 is configured to emit the emission light L in the arrow direction of FIG. 1 with a predetermined operational current.

A first face of the light emitting element 80 is mounted in one end side on the one face of the substrate 50 via the bonding material 70. For example, one face of the P-type semiconductor layer 81 is mounted in one end side on the one face of the substrate 50 via the bonding material 70. Further, a second face of the light emitting element 80 opposite to the first face is bonded to the other face of another substrate 50 of another light emitting element mounting portion 20 via the bonding material 30.

The thickness of the light emitting element 80 can be, for example, about 100 μm. As a material of the bonding material 70, for example, a conductive material such as gold-tin solder, indium solder, silver paste can be used. The thickness of the bonding material 70 can be, for example, about 5 μm.

Figure 3:
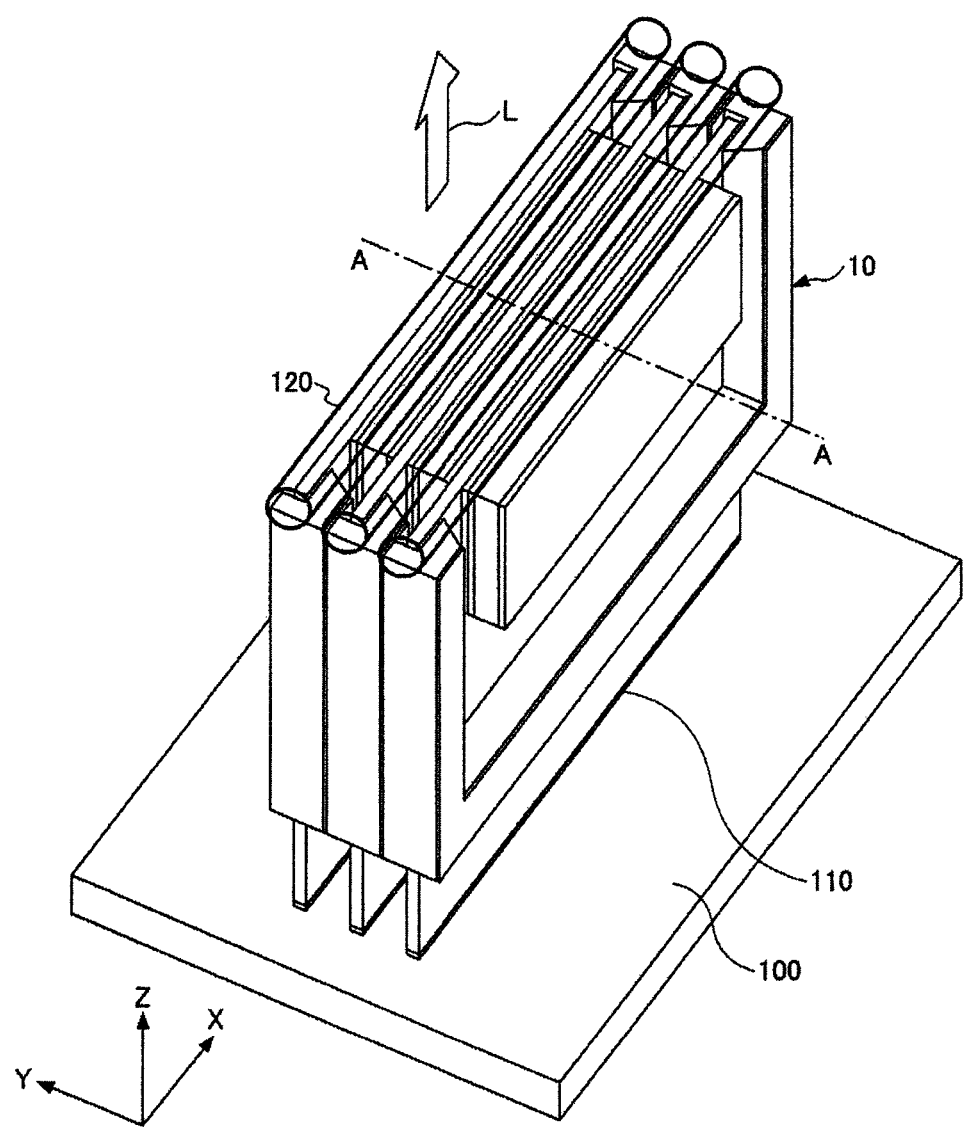
FIG. 3 is a perspective view illustrating the light emitting device according to the first embodiment.
Figure 4:
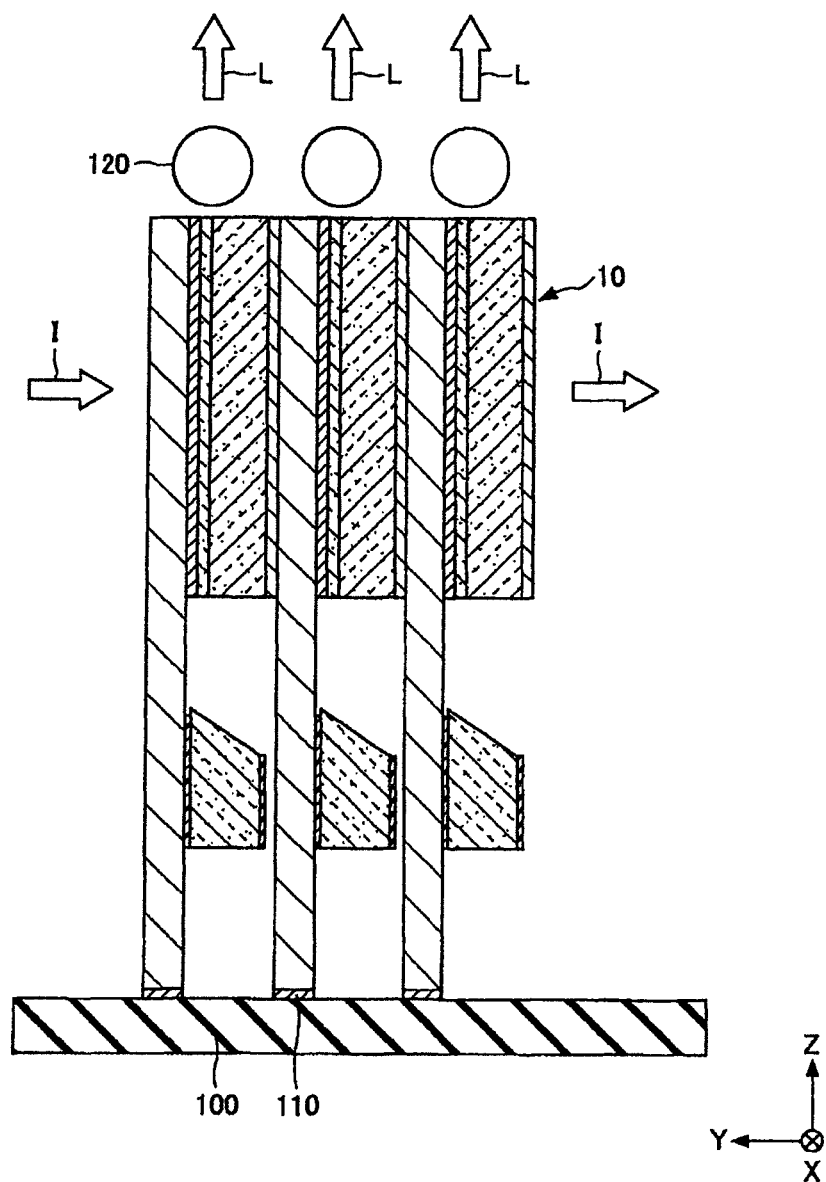
FIG. 4 is a cross-sectional view taken along line A-A of FIG. 3.

FIG. 3 is a perspective view illustrating a light emitting device according to a first embodiment of the invention. FIG. 4 is a cross-sectional view taken along line A-A of FIG. 3. The light emitting device shown in FIGS. 3 and 4 has a structure in which a face opposite to the light emitting face of each substrate 50 of the light emitting device 10 is bonded onto one face of a wiring substrate 100 via a bonding material 110.

That is, an end face of the protruding portion 50b that protrudes from the substrate holder 40 of the substrate 50 is bonded to the one face of the wiring substrate 100 via the bonding material 110 while each substrate 50 stands on the one face of the wiring substrate 100. Each light emitting element 80 has a light emitting face that is parallel to the one face of the wiring substrate 100, and can emit the emission light L toward the opposite side of the one face of the wiring substrate 100.

As the wiring substrate 100, a ceramic substrate can be used. As a material of the ceramic substrate, for example, aluminum nitride (AlN), beryllium oxide (BeO) can be used. Further, as the wiring substrate 100, other existing substrates such as an organic substrate can be appropriately used. Heat generated from each light emitting element 80 is transmitted to the wiring substrate 100 via each substrate 50, and then is radiated from the wiring substrate 100. As the bonding material 110, for example, indium solder can be used.

Further, each lens 120 is disposed on the optical path of each beam of the emission light L of each light emitting element 80. As the lens 120, for example, a cylindrical lens can be used. It is necessary for the lens 120 to be disposed on the optical path of the emission light L of each light emitting element 80 with high accuracy. The lens 120 can be disposed on the substrate holder 40 with high accuracy by, for example, disposing a lens holder (not shown) made of silicon on the light emitting end face of the substrate holder 40. On the light emitting end face of the substrate holder 40, a groove or a protruding portion for holding the lens 120 may also be formed in advance by etching.

In the light emitting device 10, each of the light emitting elements 80 are connected to each other in series. That is, current I is made to flow in series from the outermost substrate 50 in one side to the outermost light emitting element 80 in the other side via input and output terminals (not shown), and then each of the light emitting elements 80 simultaneously emits the emission light L.

In this way, if predetermined operational current is made to flow in each of the light emitting elements 80 of the light emitting device 10, the light emitting elements 80 emit light, respectively. Then, the emission light L of each of the light emitting elements 80 is condensed at a predetermined position via each of the lenses 120, and heat generated from each of the light emitting elements 80 is transmitted to the wiring substrate 100 via each of the substrates 50 and is radiated from the wiring substrate 100.

Next, a manufacturing method of the light emitting device according to the first embodiment will be now described. FIGS. 5A to 14 are diagrams illustrating the manufacturing method of the light emitting device according to the first embodiment. Particularly, FIGS. 5A to 11C are diagrams illustrating a manufacturing process of the substrate holder 40 according to the first embodiment. For example, regions on which a plurality of substrate holder 40 are to be formed are provided on one silicon substrate 410, and a plurality of substrate holders 40 are manufactured by dicing process. In FIGS. 5A to 11C, the regions on which the plurality of substrate holder 40 are to be formed are not shown for the sake of convenience of description.

Figure 5A:
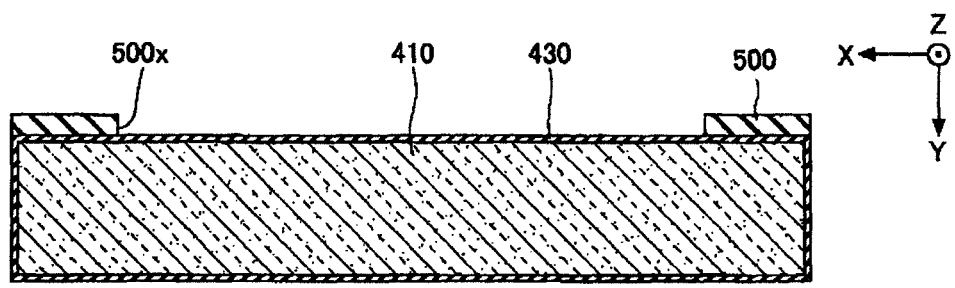
FIGS. 5A and 5B are diagrams illustrating a manufacturing process (#1) of the light emitting device according to the first embodiment.
Figure 6:
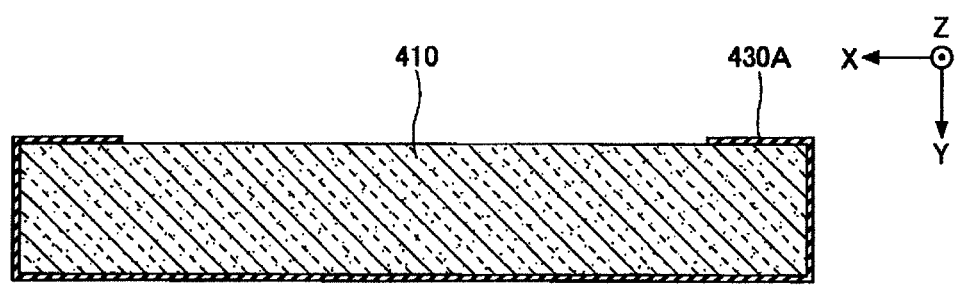
FIG. 6 is a diagram illustrating a manufacturing process (#2) of the light emitting device according to the first embodiment.
Figure 7:
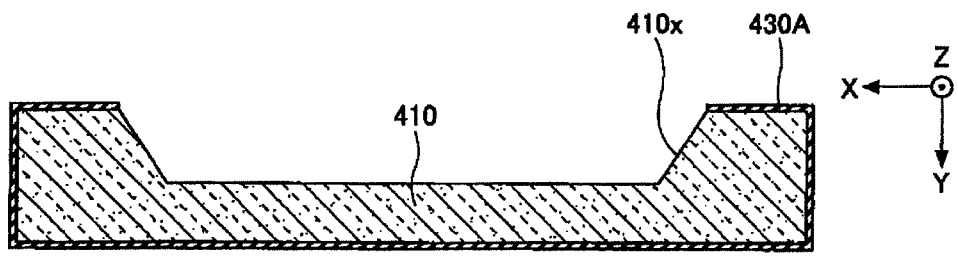
FIG. 7 is a diagram illustrating a manufacturing process (#3) of the light emitting device according to the first embodiment.
Figure 8A:
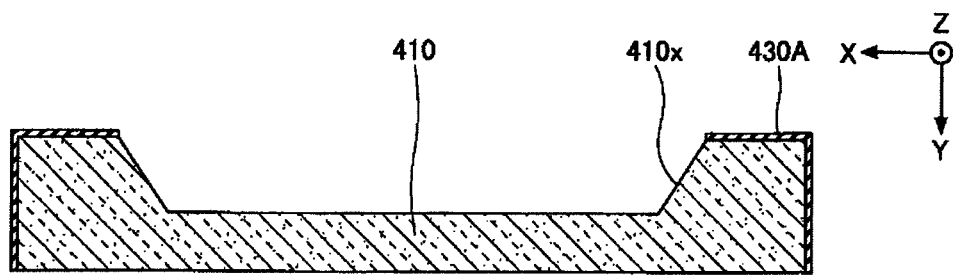
FIGS. 8A and 8B are diagrams illustrating a manufacturing process (#4) of the light emitting device according to the first embodiment.
Figure 9A:
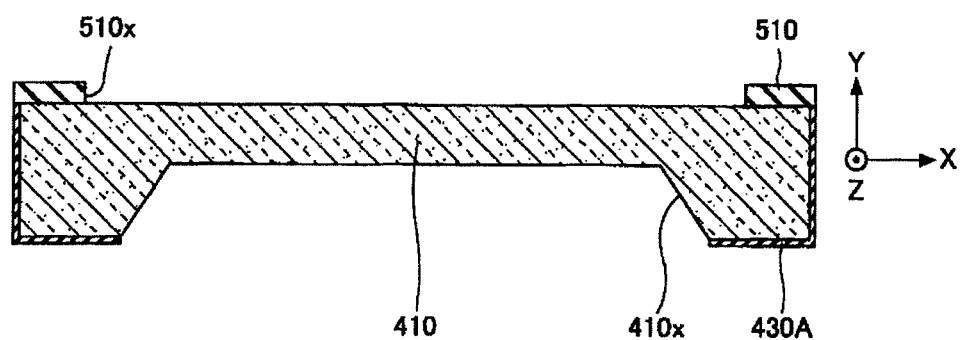
FIGS. 9A and 9B are diagrams illustrating a manufacturing process (#5) of the light emitting device according to the first embodiment.
Figure 10A:
FIGS. 10A and 10B are diagrams illustrating a manufacturing process (#6) of the light emitting device according to the first embodiment.
Figure 10B:
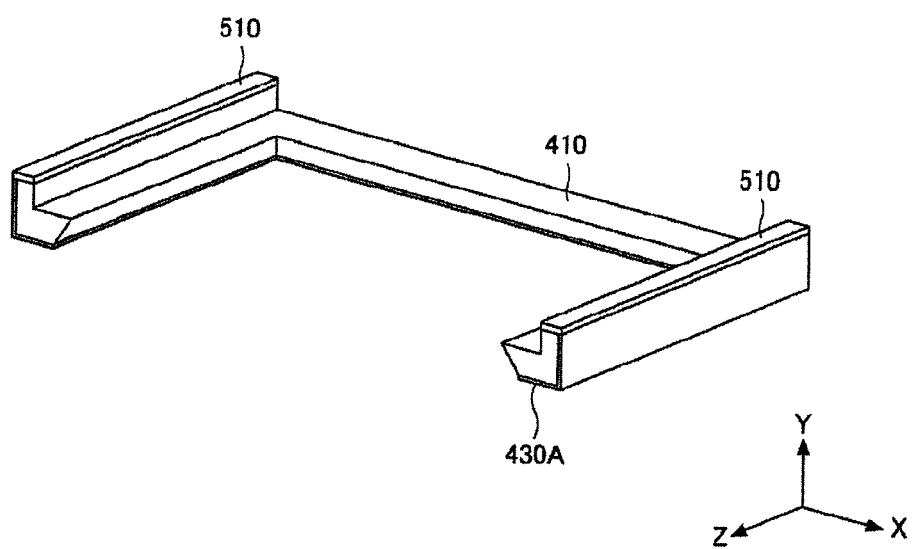
Figure 11A:
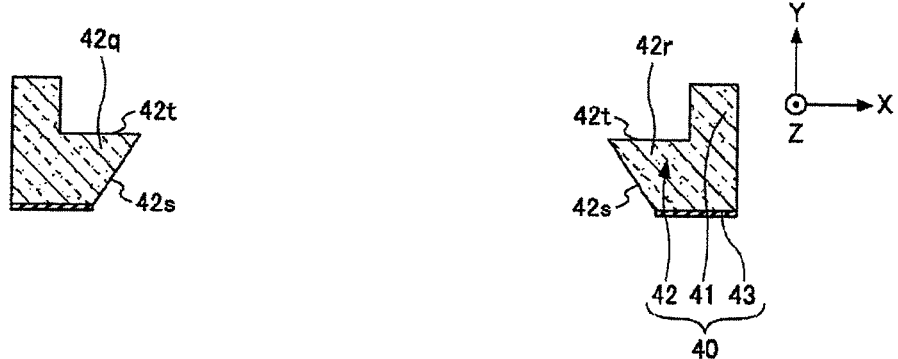
FIGS. 11A to 11C are diagrams illustrating a manufacturing process (#7) of the light emitting device according to the first embodiment.
Figure 11B:
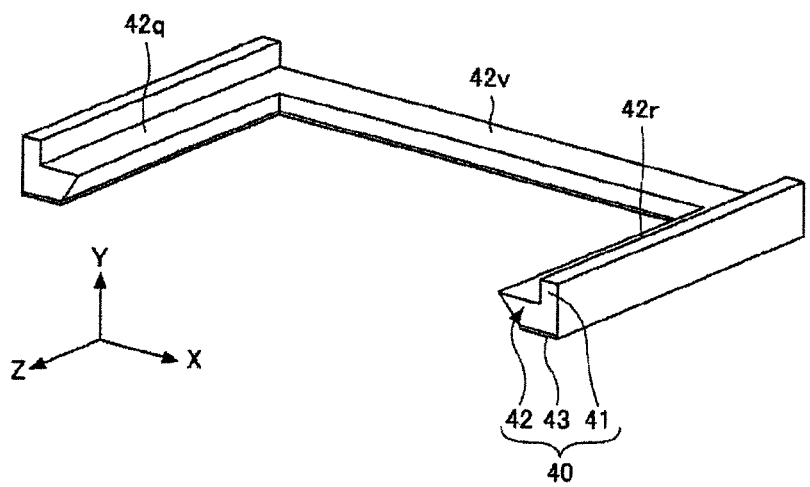
Figure 11C:
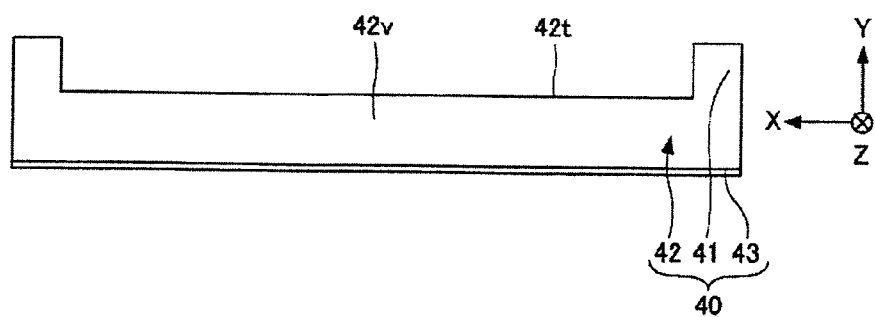
Figure 12:
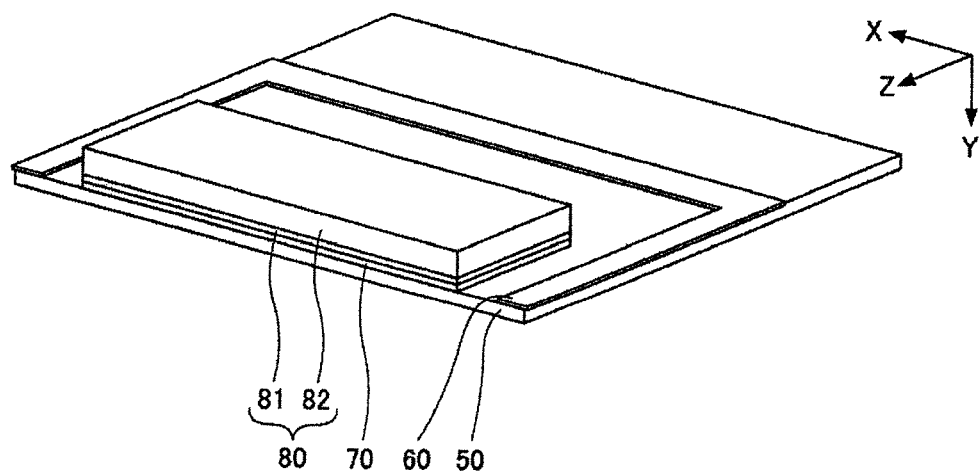
FIG. 12 is a diagram illustrating a manufacturing process (#8) of the light emitting device according to the first embodiment.
Figure 13A:
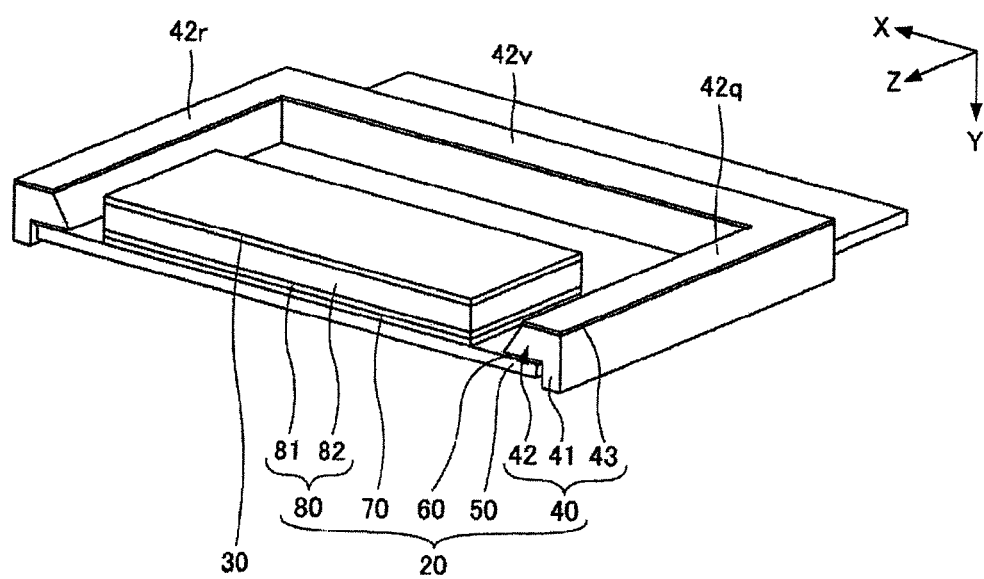
FIGS. 13A and 13B are diagrams illustrating a manufacturing process (#9) of the light emitting device according to the first embodiment.
Figure 13B:
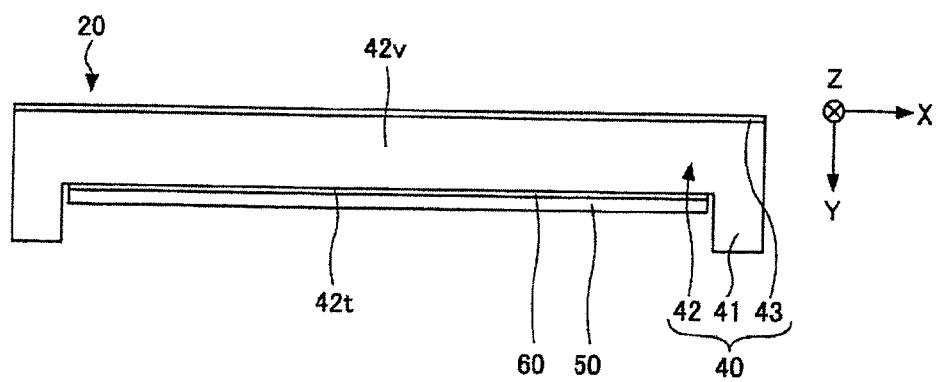
Figure 14:
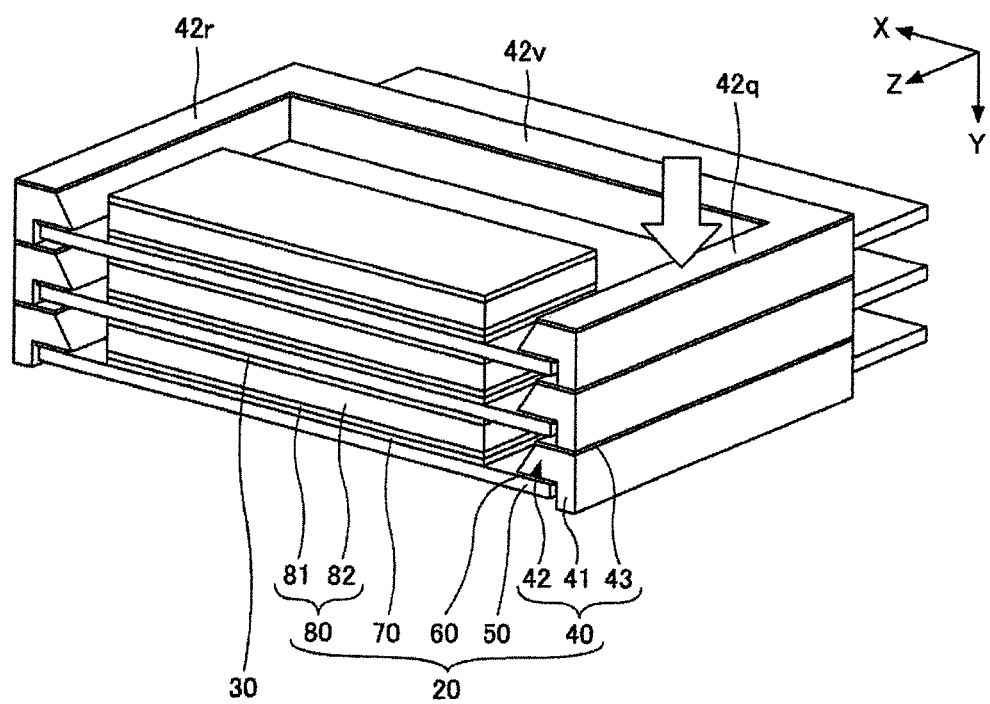
FIG. 14 is a diagram illustrating a manufacturing process (#10) of the light emitting device according to the first embodiment.

In each of FIGS. 5A, 8A and 9A is cross-sectional views, and FIGS. 5A, 8A and 9A are plan views. Further, each of FIGS. 6 and 7 is a cross-sectional view. Further, FIG. 10A is a cross-sectional view, and FIG. 10B is a perspective view. Further, FIG. 11A is a cross-sectional view, FIG. 11B is a perspective view, and FIG. 11C is a rear view. Further, FIGS. 12 and 14 are perspective views. Further, FIG. 13A is a perspective view, and FIG. 13B is a rear view.

Figure 5B:
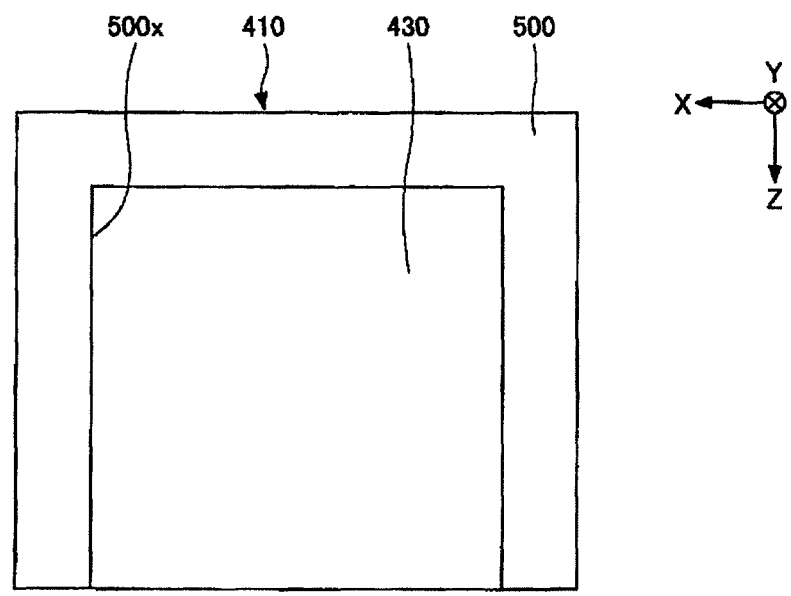

First of all, in the process shown in FIGS. 5A and 5B, the silicon substrate 410 is prepared, and an insulating film 430 is formed on the surface of the silicon substrate 410. As the insulating film 430, an $SiO_2$ film can be formed by performing thermal oxidation using a wet thermal oxidation method. A temperature around the surface of the silicon substrate 410 is set to be, for example, 1000° C. or higher. The thickness of the insulating film 430 can be, for example, about 1 μm. As the insulating film 430, a film of, for example, silicon oxide ($SiO_2$), silicon nitride (SiN), polyimide (PI) may be formed by a CVD (Chemical Vapor Deposition) method.

In addition, on a first face of the silicon substrate 410 of which the surface is formed with the insulating film 430, a resist layer 500 is formed which has "U" shape in a plan view and has an opening portion 500x corresponding to a region where the insulating film 430 is removed. For example, the resist layer 500 is formed within the range of a predetermined width from the sides (except one side) of the first face of the silicon substrate 410 in a plan view. For example, the resist layer 500 is formed by coating the first face of the silicon substrate 410 with a photosensitive resin, and then the opening portion 500x can be formed by photolithography.

Next, in the process shown in FIG. 6, the insulating film 430 exposed through the opening portion 500x shown in FIGS. 5A and 5B is removed by wet etching, and then the resist layer 500 is removed. As an etching solution for removing the insulating film 430, for example, an alkaline solution such as KOH (potassium hydroxide), TMAH (tetramethylammonium hydroxide) can be used. Hereinafter, the insulating film 430 of which a portion has been removed is referred to as an insulating film 430A.

Next, in the process shown in FIG. 7, a groove 410x is formed by removing a portion of the silicon substrate 410 on which the insulating film 430A has not been formed by using wet etching. In the process of the wet etching, the insulating film 430A is used as a mask. The inner faces of the groove 410x become inclined faces (a tapered shape). In the process, for example, the same etching solution as in the process shown in FIG. 6 can be used.

Figure 8B:
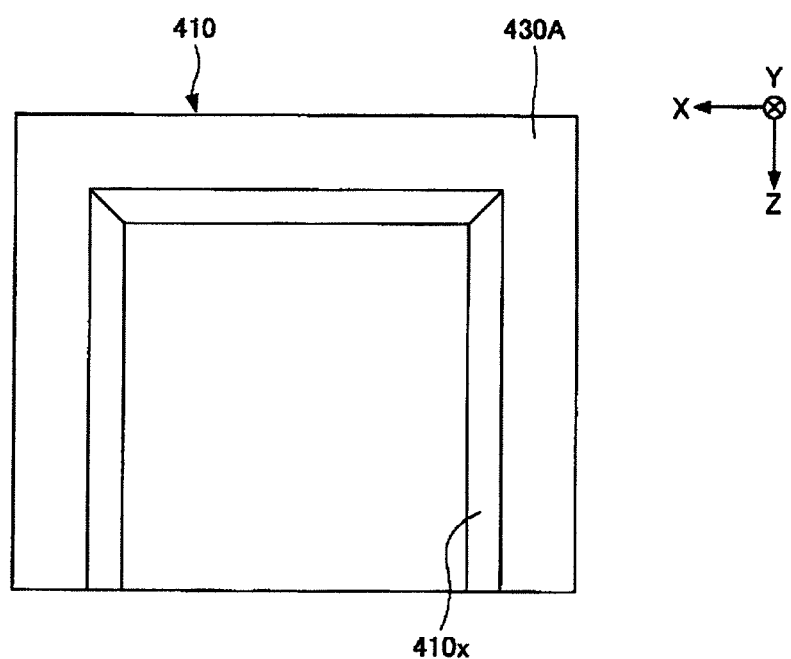

Next, in the process shown in FIGS. 8A and 8B, a second face of the silicon substrate 410 (the face in which the groove 410x is not formed) is ground using a backside grinder so as to remove the insulating film 430A that covers the second face of the silicon substrate. Alternatively, the silicon substrate 410 is made to be thin, if necessary, together with the removal of the insulating film 430A that covers the opposite face thereof.

Figure 9B:
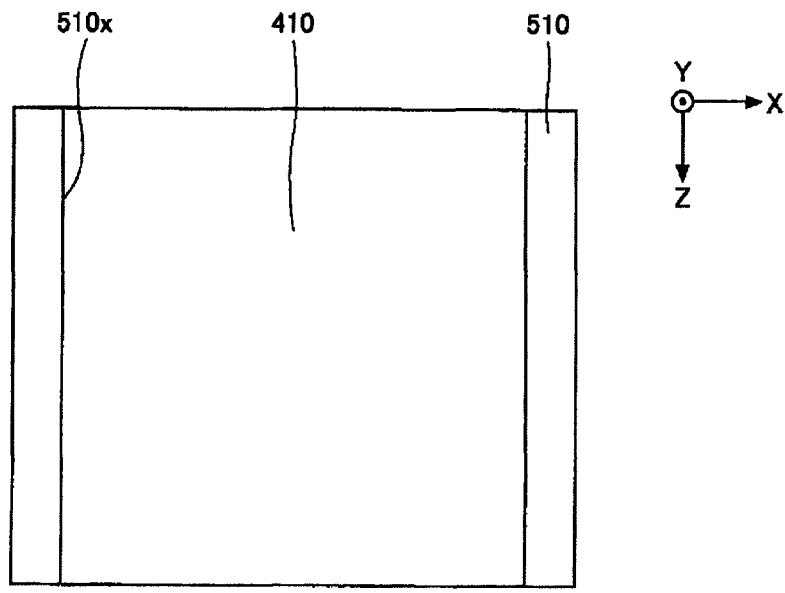

Next, in the process shown in FIGS. 9A and 9B, a resist layer 510 having an opening portion 510x is formed on the second face of the silicon substrate 410 in order to form the column 41 and the protrusion 42. For example, in a plan view, the resist layer 510 is formed with the range of a predetermined width from facing sides among the sides of the first face of the silicon substrate 410. The resist layer 510 is formed by, for example, coating a photosensitive resin on the second face of the silicon substrate 410, and then the opening portion 510x can be formed by photolithography. FIGS. 9A to 11C are depicted upside down from the state of FIG. 1, and the like.

Next, in the process shown in FIGS. 10A and 10B, the silicon substrate 410 that is exposed through the opening portion 510x is removed to the grove 410x by dry etching. Accordingly, the silicon substrate 410 is formed in "U" shape, when viewed from the top. As the dry etching, for example, reactive ion etching (DRIE: Deep Reactive Ion Etching) using $SF_6$ (sulfur hexafluoride), or the like is favorably used.

Next, in the process shown in FIGS. 11A to 11C, the peripheral portion of the insulating film 430A formed in "U" shape as shown in FIG. 10 is cut by, for example, dicing. Accordingly, the substrate holder 40 is formed to have the column 41, the protrusion 42 including the outer circumferential portions 42r and 42q and the center portion 42v, and the insulation film 43, which are formed of silicon.

Next, in the process shown in FIG. 12, at one end side of one face of the substrate 50 formed of a copper-tungsten (CuW), the light emitting element 80 that is a semiconductor laser diode is mounted via the bonding material 70. The thickness of the substrate 50 can be, for example, about 100 to 400 μm. As a material of the bonding material 70, for example, a conductive material such as gold-tin solder, indium solder, silver paste, or the like, can be used. The thickness of the bonding material 70 can be, for example, about 5 μm.

Subsequently, the adhesive material 60 is formed on the substrate 50 to correspond to the region where the substrate 50 is bonded to the substrate holder 40. The adhesive material 60 is formed by applying, for example, a photosensitive adhesive agent to the substrate 50 and patterning the photosensitive adhesive agent through photolithography. The thickness of the adhesive material 60 can be set to, for example, about 5 μm. In the present embodiment, three structures shown in FIG. 12 are prepared.

Next, in the process shown in FIGS. 13A and 13B, via the adhesive material 60, the portion including the outer circumferential portion of one face of the substrate 50 is brought into contact with the bottom face 42t of the protrusion 42 of the substrate holder 40 prepared in the process shown in FIG. 11. Then, the adhesive material 60 is hardened by heating, so that the portion including the outer circumferential portion of the one face of the substrate 50 is bonded to the bottom face 42t of the protrusion 42 via the adhesive material 60. In the present embodiment, three structures shown in FIG. 13 are prepared.

Next, in the process shown in FIG. 14, the three structures shown in FIG. 13 are stacked via the bonding materials 30. Then, the upper face of the column 41 of one substrate holder 40 is bonded to the bottom face of the column 41 of another substrate holder 40 via the insulating film 43 while the bonding material 30 is heated. After that, the bonding material 30 is hardened. Accordingly, the light emitting device 10 is completed.

As such, in the first embodiment, the plurality of the light emitting element mounting units 20 on which the light emitting elements 80 are mounted are stacked on top of each other in the light emitting device 10. However, the pitch of the light emitting elements 80 is determined by the height H of the column 41 of the substrate holder 40 that is made of silicon. Since silicon can be processed with extremely high accuracy through the photolithography such as etching, the light emitting elements 80 can be stacked with high pitch accuracy.

Further, since the thickness of the substrate 50 on which the light emitting elements 80 are mounted does not contribute to the pitch of the light emitting elements 80, the thickness is not important even if the substrate is made to be thin and then the thickness accuracy is degraded. In other words, by reducing the thickness of the substrate 50, the light emitting elements 80 can be stacked on top of one another with a narrow or high pitch accurately. Unevenness in the thickness of the substrate 50 is relaxed by the bonding material 30.

In the present embodiment, the light emitting elements 80 can be stacked at, for example, a pitch of 200 μm, and unevenness in the pitch can be suppressed to about ±5 μm. Meanwhile, in a prior-art light emitting device, it is very hard to stack light emitting elements at a pitch of 400 μm or less, and unevenness of the pitch is about ±10 μm.

Figure 15:
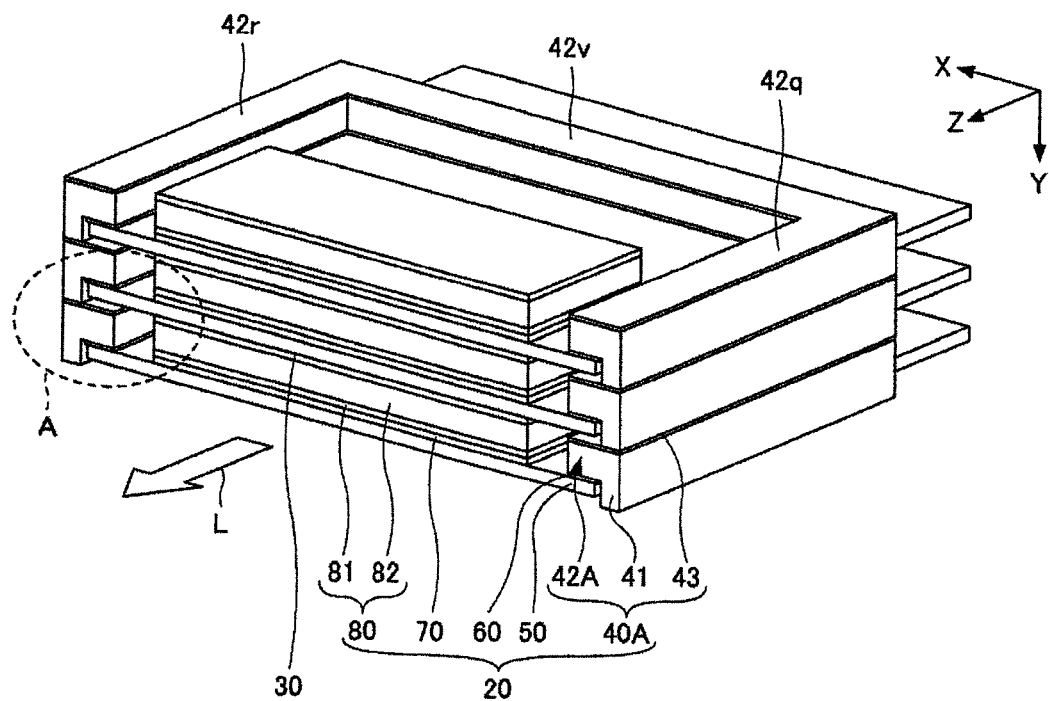
FIG. 15 is a perspective view illustrating a light emitting device according to a first modified example of the first embodiment.
Figure 16:
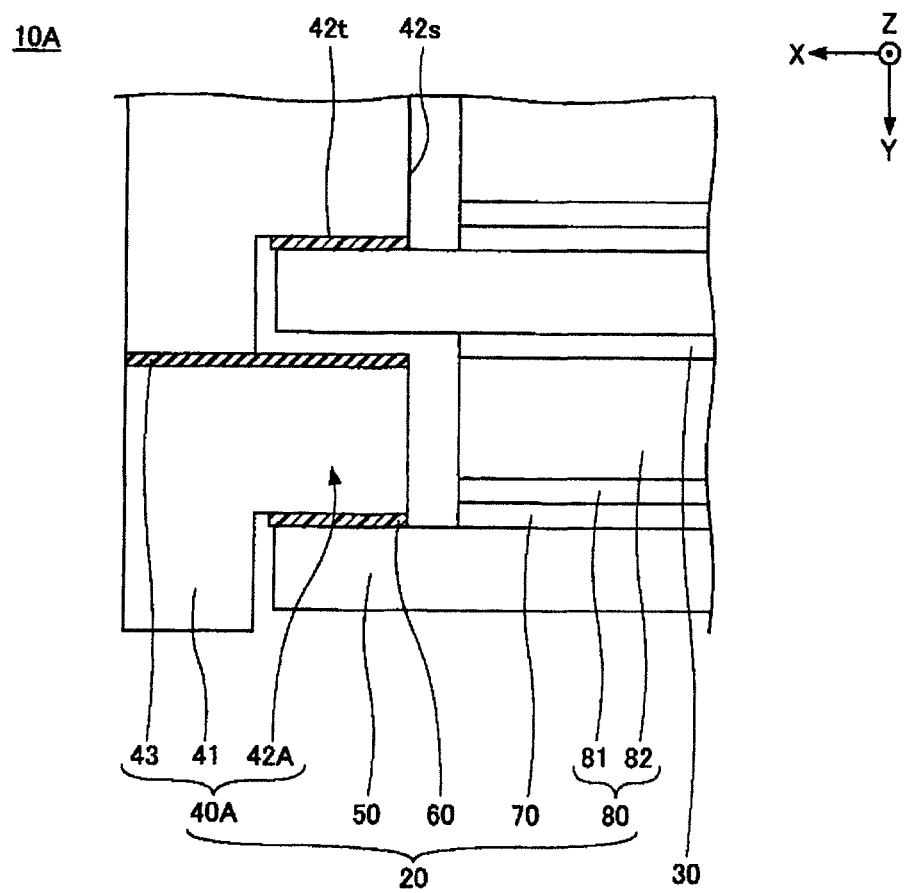
FIG. 16 is a front view illustrating a portion A of FIG. 15 in an enlarged manner.

FIG. 15 is a perspective view illustrating a light emitting device according to a first modified example of the first embodiment. FIG. 16 is a front view illustrating the portion A of FIG. 15 in an enlarged manner. Referring to FIGS. 15 and 16, the light emitting device 10A is different from the light emitting device 10 (see FIGS. 1A, 1B and 2) in that the substrate holder 40 is replaced by a substrate holder 40A (the protrusion 42 is replaced by a protrusion 42A).

In the first embodiment, the inner side face 42s (the inner side portion in the "U" shape) of the substrate holder 42 is set to an inclined face, but the inner side face 42s can be set as a vertical face as in the protrusion 42A of the light emitting device 10A shown in FIG. 16.

Figure 17:
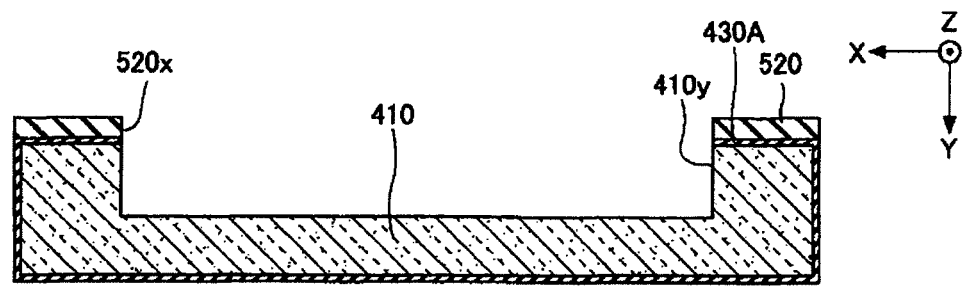
FIG. 17 is a diagram illustrating a manufacturing process (#1) of the light emitting device according to the first modified example of the first embodiment.

In order to set the inner side face 42s of the protrusion 42A as a vertical face, the same processes to those of FIGS. 5A, 5B and 6 of the first embodiment are performed, and then, the process shown in FIG. 17 is performed instead of the process shown in FIGS. 8A and 8B (the wet etching process). In the process shown in FIG. 17, a resist layer 520 having an opening portion 520x is formed on one face of the silicon substrate 410. The resist layer 520 can be formed in, for example, the same manner as that of the resist layer 510. Then, the portion of the silicon substrate 410 that is exposed through the opening portion 520x is removed by dry etching so as to form a groove 410y. An inner side face of the groove 410y is set to a vertical face.

Figure 18:
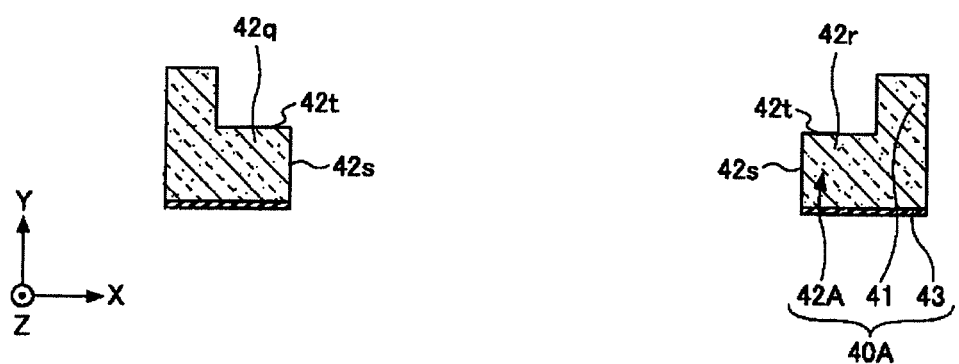
FIG. 18 is a diagram illustrating a manufacturing process (#2) of the light emitting device according to the first modified example of the first embodiment.

After that, the same processes as those of FIGS. 9A to 10B of the first embodiment are performed, and then, in the process shown in FIG. 18, the peripheral portion where the insulating film 430A of the outer side face of the "U" shape of the structure shown in FIG. 10 is formed is cut by, for example, dicing. Accordingly, the substrate holder 40A having the column 41, the protrusion 42A including the outer circumferential portions 42r and 42q and the center portion 42v, and the insulation film 43 is formed of silicon.

In this way, the same effect as that of the first embodiment is exhibited even if the inner side face 42s of the protrusion 42A is set to a vertical face.

Figure 19A:
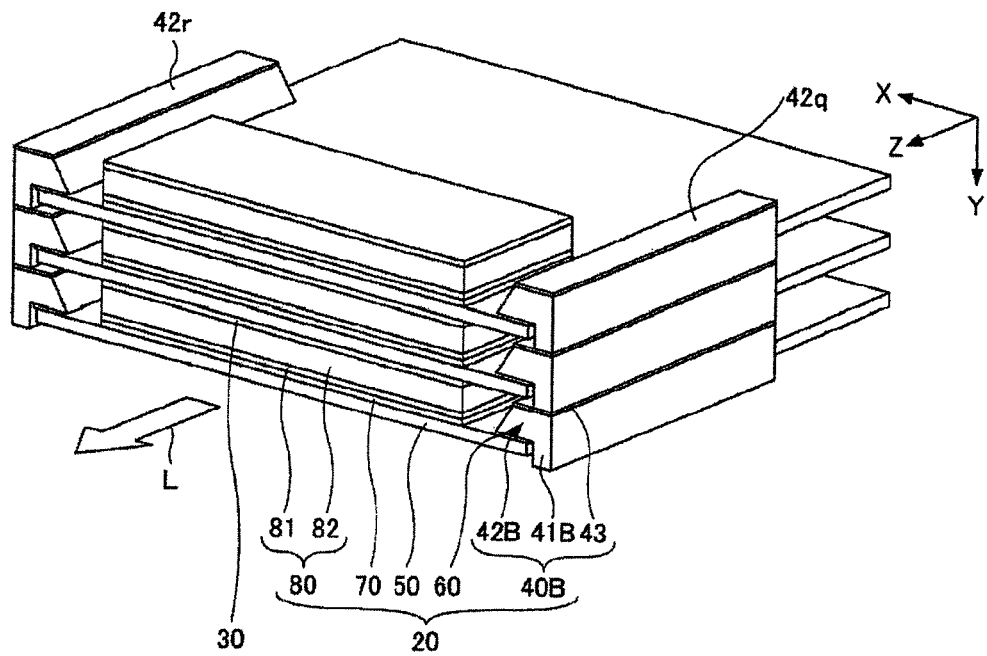
FIGS. 19A and 19B are perspective views illustrating a light emitting device according to a second modified example of the first embodiment.
Figure 19B:
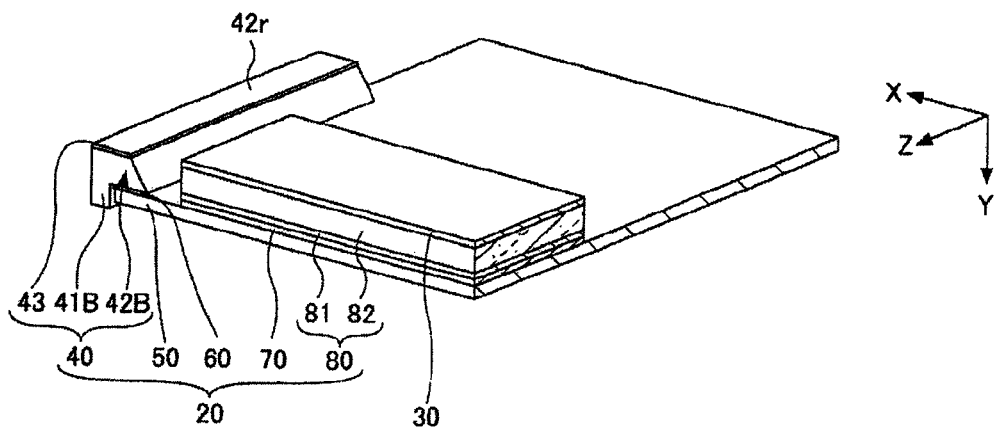

FIGS. 19A and 19B are perspective views illustrating a light emitting device according to a second modified example of the first embodiment. Referring to FIGS. 19A and 19B, the light emitting device 10B is different from the light emitting device 10 (see FIGS. 1A, 1B and 2) in that the substrate holder 40 is replaced by the substrate holder 40B (the column 41 is replaced by a column 41B and the protrusion 42 is replaced by a protrusion 42B).

In the first embodiment, the substrate holder 40 is formed in "U" shape, but in the second modified example of the first embodiment, the substrate holder 40B of the light emitting element mounting unit 20 has a shape in which "U" shaped center portion 42v of the substrate holder 40 is removed. In other words, the substrate holder 40B including the column 41B and the protrusion 42B is disposed on each side of the substrate 50 such that the column 41B on one side of the substrate 50 faces the column 41B on the other side of the substrate 50 via the substrate 50.

When the substrate holder 40B is prepared, for example, the resist layer 500 is formed within the range of a predetermined width from the side facing each other among the sides of one face of the silicon substrate 410 in a plan view in the process shown in FIGS. 5A and 5B of the first embodiment. Then, in the process shown in FIG. 6 of the first embodiment, the insulating film 430 that is exposed though the opening portion 500x is removed by wet etching. Then, the resist layer 500 is removed so as to form the insulating film 430A. The insulating film 430A is formed within the range of a predetermined width from the side facing each other among the sides of the one face of the silicon substrate 410. After that, the same processes as those of FIGS. 7 to 11C of the first embodiment may be performed using the insulating film 430A as a mask.

In this manner, the same effect as that of the first embodiment is exhibited even when the pair of the substrate holders 40B of which the plane shapes are rectangles are disposed on both sides of the substrate 50. In the same manner as in the first modified example of the first embodiment, the inner side face of the protrusion 42B may set to be a vertical face.

Second Embodiment

In a second embodiment, an example will be described in which a plurality of conductive substrates each mounting a light emitting element thereon are stacked on top of one another at a predetermined pitch and are held by one substrate holder. Especially, in this embodiment, the respective conductive substrates are stacked at the same pitch. In the second embodiment, description of the same constituent parts as those in the above-described embodiment will be omitted herein.

Figure 20:
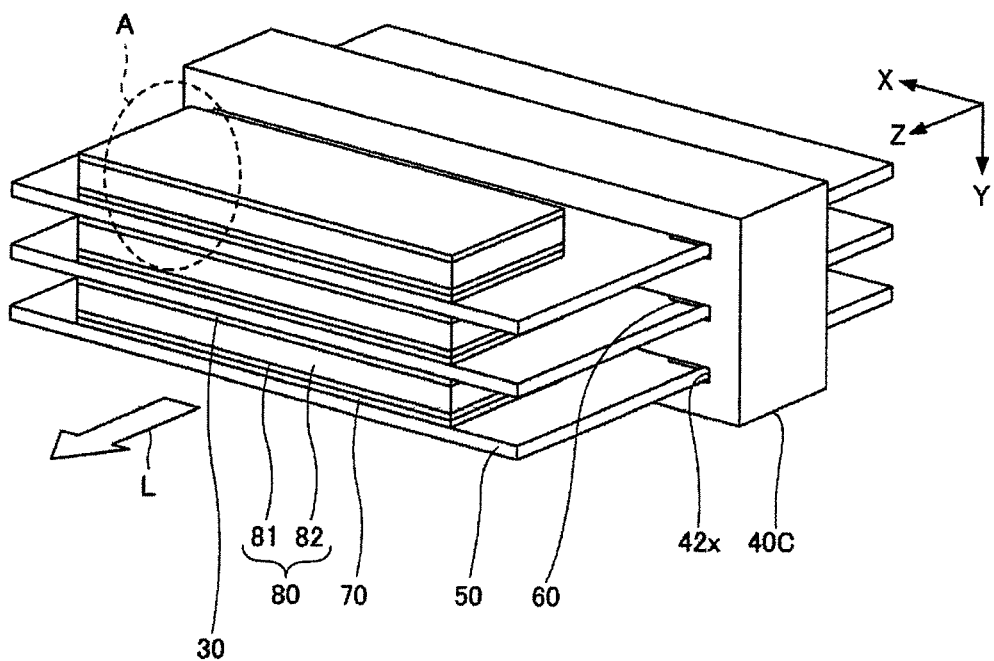
FIG. 20 is a perspective view illustrating a light emitting device according to a second embodiment.
Figure 21:
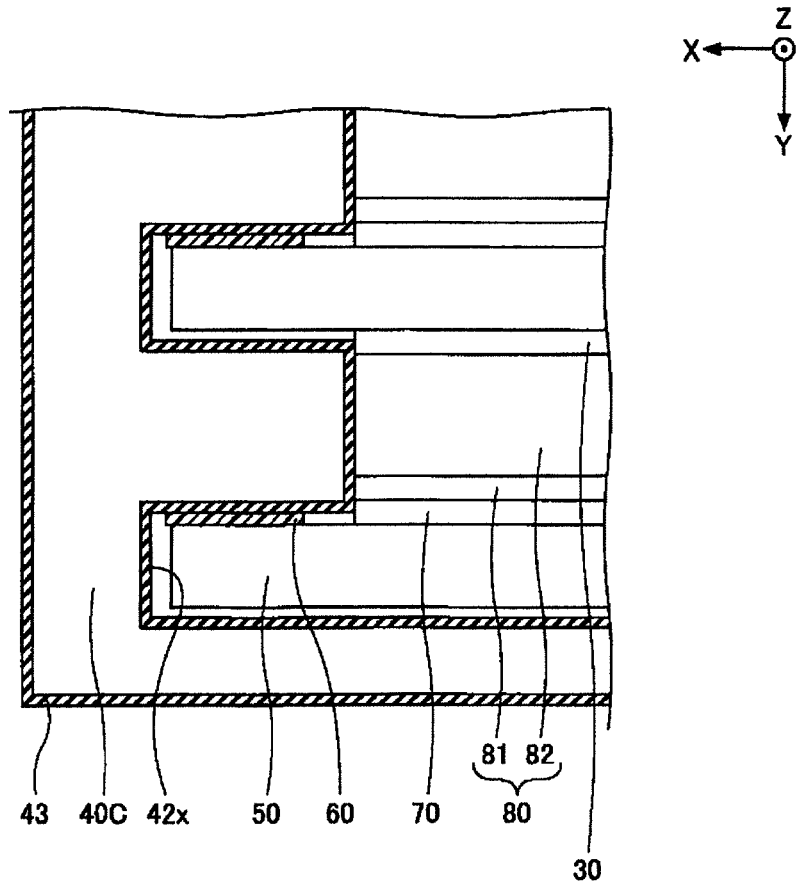
FIG. 21 is a front view illustrating a portion A of FIG. 20 in an enlarged manner.

FIG. 20 is a perspective view illustrating a light emitting device according to the second embodiment. FIG. 21 is a front view illustrating the portion A of FIG. 20 in an enlarged manner. Referring to FIGS. 20 and 21, the light emitting device 10C is different from the light emitting device 10 (see FIGS. 1A, 1B and 2) in that the substrate holder 40 is replaced by the substrate holder 40C.

In the first embodiment, the substrate holder 40 is provided in the direction parallel to the substrate 50, but in the second embodiment, the substrate holder 40C is provided in the direction vertical to the substrate 50.

The substrate holder 40C is a plate-like member made of silicon and has a plurality of through holes 42x formed in an elongated shape (slit shape) that are arranged at a predetermined pitch (the same pitch) in the direction in which the substrates 50 are stacked on top of one another. The through hole 42x is formed to allow the substrate 50 to pass through the through hole 42x. Each of the substrates 50 is inserted through a corresponding one of the through holes 42x, and is bonded to the inner wall face of the corresponding through hole 42x via the adhesive material 60. Especially, each of the substrate 50 might be bonded to the upper surface (one surface) of the inner wall face of the corresponding through hole 42z.

Each of the substrates 50 and the substrate holder 40C needs to be electrically insulated from each other. As shown in FIG. 21, for example, on the surface of the substrate holder 40C including the inner wall faces of each of the through holes 42x, an insulating film of $SiO_2$ may be formed. Alternatively, a ceramic that is an insulating material may be used as the substrate holder 40C instead of silicon. When a ceramic is used as the substrate holder 40C, the through holes 42x can be formed using, for example, an ultrasonic machining method.

The heat-radiating property can be enhanced by using a ceramic material having a thermal conductivity closer to that of the substrate 50 that is a copper-tungsten (CuW) substrate, as a material of the substrate holder 40C. The thermal conductivity of the copper-tungsten (CuW) substrate is about 160 W/m·K, the thermal conductivity of silicon (Si) is about 149 W/m·K, and the thermal conductivity of a silicon oxide ($SiO_2$) film is about 10 W/m·K or lower. Further, the thermal conductivity of an aluminum nitride (AlN) that is a ceramic material is about 150 W/m·K.

Therefore, by using, for example, the aluminum nitride (AlN) as the material of the substrate holder 40C, the heat-radiating property can be enhanced as compared with the case where silicon (Si) is used as the material of the substrate holder 40C and a silicon oxide ($SiO_2$) film is formed on the surface thereof.

In this manner, the same effect as that of the first embodiment can be obtained even when the substrate holder 40C is used in which the plurality of through holes 42x of an elongated shape (slit shape) are arranged at a predetermined pitch in the direction in which the substrates 50 are stacked on top of one another.

Third Embodiment

A third embodiment is another example in which plural conductive substrates each mounted with a light emitting element on one surface are held by one substrate holder and stacked at a prescribed pitch. In the third embodiment, descriptions of constituent parts having the same ones in the above-described embodiments will be omitted.

Figure 22:
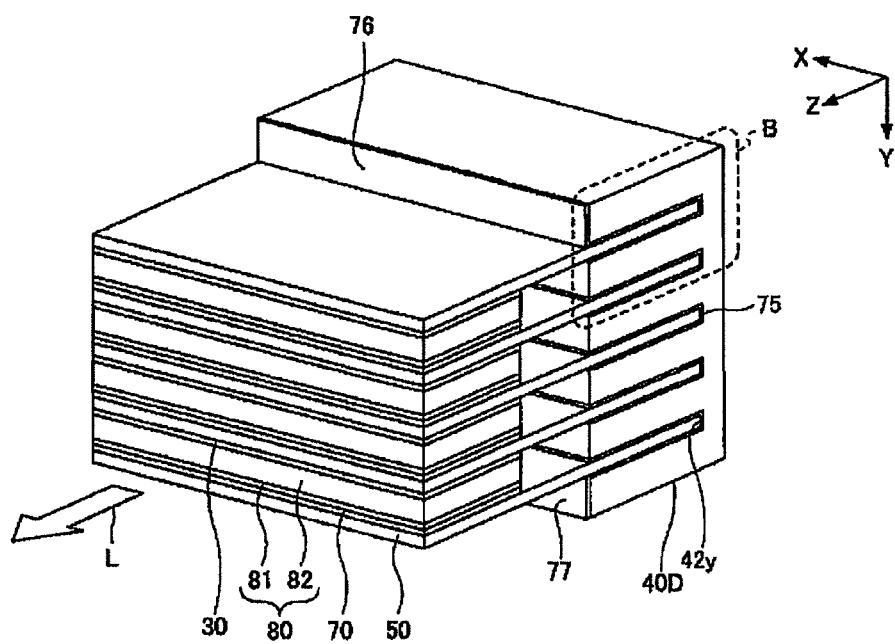
FIG. 22 is a perspective view (#1) illustrating a light emitting device according to a third embodiment.
Figure 23:
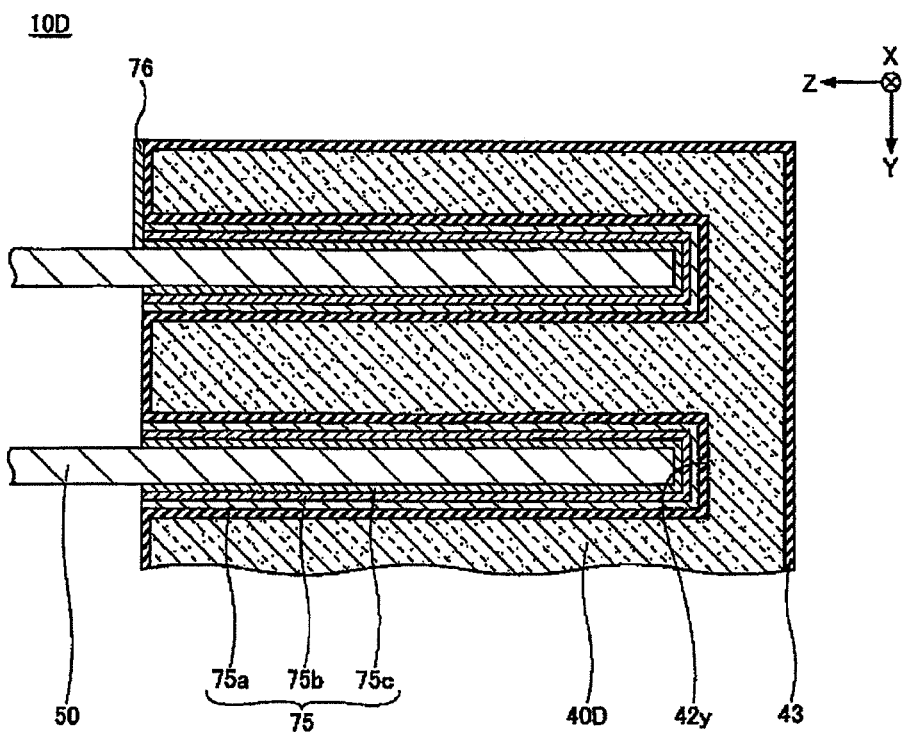
FIG. 23 is a partial cross-section view illustrating a portion B of FIG. 22.

FIG. 22 is a perspective view of a light emitting device 10D according to the third embodiment. FIG. 23 is a sectional view of part B shown in FIG. 22, and shows a cross section which is parallel with the YZ plane. An insulating film 43 shown in FIG. 23 is omitted in FIG. 22.

As shown in FIGS. 22 and 23, the light emitting device 10D is different from the light emitting device 10 (see FIGS. 1A and 1B and FIG. 2) in that the substrate holder 40 is replaced by a substrate holder 40D.

The substrate holder 40D is made of silicon. A prescribed surface (light-emission-side surface) of the substrate holder 40D is formed with a plurality of elongated (slit shape) grooves 42y in such a manner that they are arranged at a prescribed pitch in the stacking direction of substrates 50. Each groove 42y has openings in the two respective side surfaces, perpendicular to the prescribed surface (light-emission-side surface), of the substrate holder 40D. The insulating film (made $SiO_2$ or the like) is formed on the surfaces of the substrate holder 40D including the inner wall surfaces of the grooves 42y.

A first metal layer 75 is formed on the inner wall surfaces of the grooves 42y via the insulating film 43. As shown in FIG. 23, the first metal layer 75 may consist of a metal layer 75a which is formed on the inner wall surfaces of the grooves 42y via the insulating film 43, a metal layer 75b which covers the metal layer 75a, and a metal layer 75c which covers the metal layer 75b.

The metal layer 75a may be made of a metal material that provides high adhesion to silicon, such as titanium (Ti) or tungsten (W). The thickness of the metal layer 75a may be set at about 0.05 μm. The metal layer 75b may be made of a metal material such as nickel (Ni). The thickness of the metal layer 75b may be set at about 3 μm.

The metal layer 75c may be made of a solder material such as tin (Sn), tin-silver (Sn—Ag), or tin-gold (Sn—Au). The thickness of the metal layer 75c may be set at about 10 μm. The metal layer 75b has a function of preventing the solder material of the metal layer 75c from diffusing into the metal layer 75a.

Each groove 42y has such a size as to allow insertion of a substrate 50, and portions (not mounted with light emitting elements 80) of the substrates 50 are inserted in the grooves 42y, respectively. When the substrates 50 are inserted into the respective grooves 42y and the solder material of the metal layer 75c is melted and then solidified, electrical continuity is established between the first metal layer 75 and the conductive substrates 50 and the portions (not mounted with light emitting elements 80) of the substrates 50 are bonded to the inner walls of the grooves 42y.

A second metal layer 76 and a third metal layer 77 are formed on one end portion and the other end portion (i.e., two portions outside, in the Y direction, the area where the grooves 42y are arranged) of the prescribed surface of the substrate holder 40D, respectively. The second metal layer 76 is in physical and electrical contact with the end face of that part of the first metal layer 75 which is formed in the groove 42y that is closest to the one end portion of the prescribed surface. The third metal layer 77 is in physical and electrical contact with the end face of that part of the first metal layer 75 which is formed in the groove 42y that is closest to the other end portion of the prescribed surface.

The plural light emitting elements 80 are connected in series between the second metal layer 76 and the third metal layer 77 via the portions of the first metal layer 75 formed in the grooves 42y and the substrates 50. The second metal layer 76 and the third metal layer 77 may be made of gold (Au). Alternatively, each of the second metal layer 76 and the third metal layer 77 may have the same layered structure as the first metal layer 75 and be formed so as to be integral with the first metal layer 75.

As described above, the light emitting elements 80 are connected to each other in series via the portions of the first metal layer 75 and the substrates 50. Therefore, the light emitting elements 80 can emit light at the same time by supplying a current from an input terminal to an output terminal, the input terminal being one of the second metal layer 76 and the third metal layer 77 and the output terminal being the other.

Although in this embodiment the width (in the X direction) of the substrates 50 is the same as that of the light emitting elements 80, as in the first embodiment the width (in the X direction) of the substrates 50 may be set greater than that of the light emitting elements 80.

Figure 24:
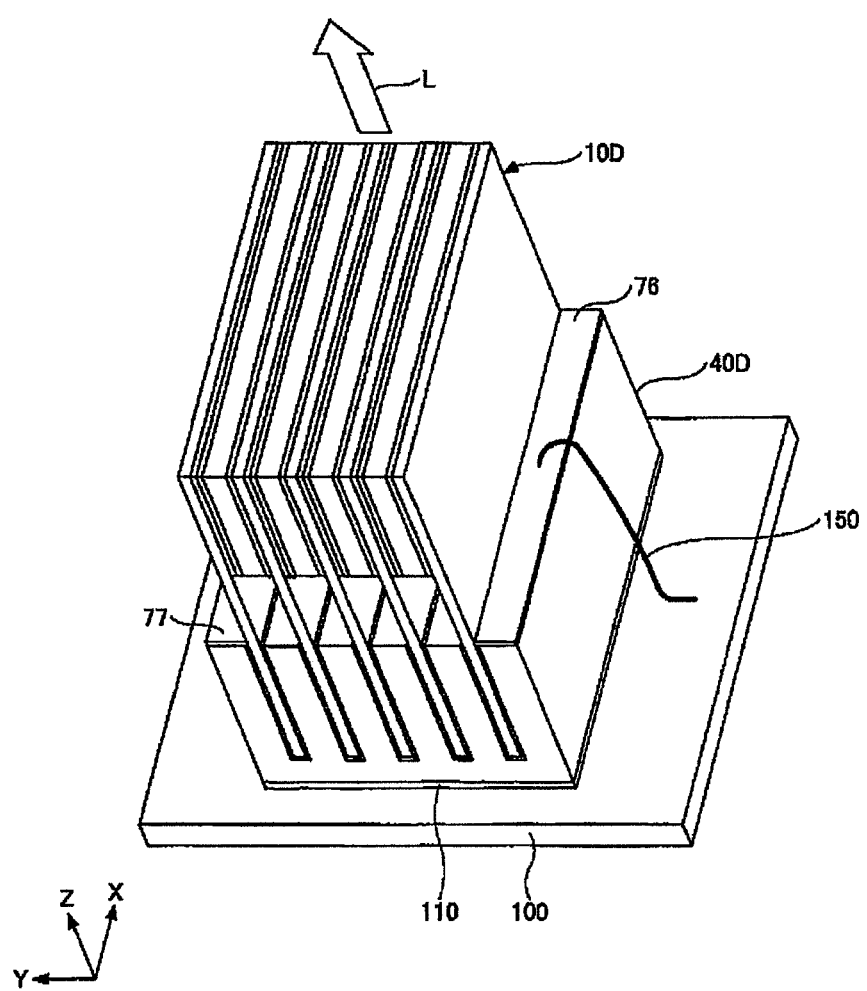
FIG. 24 is a perspective view (#2) illustrating the light emitting device according to the third embodiment.

As shown in FIG. 24, a structure may be employed in which the back surface (opposite to the prescribed surface) of the substrate holder 40D is bonded to one surface of a wiring board 100 via a bonding material 110. The bonding material 110 may be an indium solder or an insulating adhesive such as an epoxy resin or a silicone resin.

As shown in FIG. 24, the second metal layer 76 and the third metal layer 77 which are formed on the one portion and the other portion of the prescribed surface of the substrate holder 40D are electrically connected to traces (not shown) on the wiring board 100 by metal wires 150 (copper wires, gold wires, or the like) such as bonding wires, respectively. However, the metal wire 150 which electrically connects the third metal layer 77 to the traces (not shown) on the wiring board 100 is not shown in FIG. 24. As in the example of FIG. 3, lenses 120 may be disposed on the optical paths of light beams emitted from the light emitting elements 80, respectively.

Figure 25A:
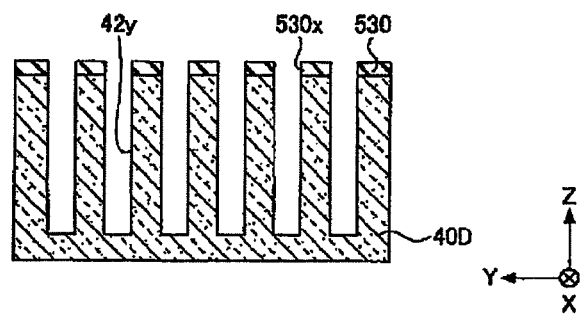
FIGS. 25A to 25D are views illustrating manufacturing processes of the light emitting device according to the third embodiment.

For example, the light emitting device 10D is manufactured in the following manner. First, as shown in FIG. 25A, in the same manner as shown in FIG. 9, a resist layer 530 is formed on the prescribed surface (in FIG. 25, the top surface) of a silicon substrate so as to have openings 530x which expose portions where grooves 42y are to be formed. The portions, exposed by the openings 530x, of the silicon substrate are removed by dry etching, whereby a substrate holder 40D is provided with grooves 42y each corresponding to one of the openings 530x formed on the prescribed surface. For example, DRIE (deep reactive ion etching) using $SF_6$ (sulfur hexafluoride) is a suitable dry etching method.

Figure 25B:
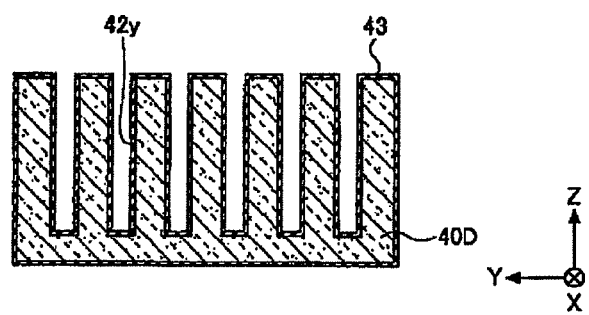

Then, in the step shown in FIG. 25B, in the same manner as in the step shown in FIGS. 5A and 5B, an insulating film 43 is formed on the surfaces of the substrate holder 40D including the inner wall surfaces of the grooves 42y.

Figure 25C:
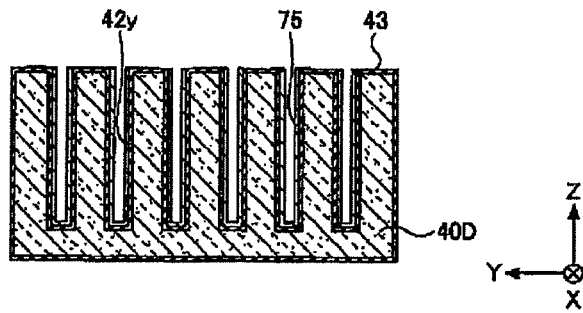

Then, as shown in FIG. 25C, a first metal layer 75 is formed on the inner wall surfaces of the grooves 42y via the insulating film 43. More specifically, metal layers 75a, 75b, and 75c (not shown in FIG. 25C) are formed sequentially on the portions, formed on the inner wall surfaces of the grooves 42y, of the insulating film 43 by sputtering, evaporation, plating, or the like. The materials of the metal layers 75a, 75b, and 75c are the same as described above.

Figure 25D:
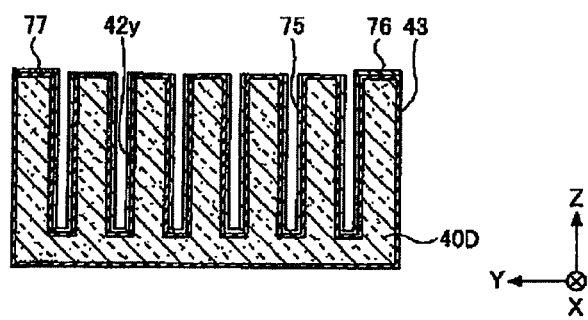

Then, in the step shown in FIG. 25D, a second metal layer 76 and a third metal layer 77 are formed on the one side portion and the other side portion (i.e., two portions outside, in the Y direction, the area where the grooves 42y are arranged) of the prescribed surface of the substrate holder 40D, respectively. The second metal layer 76 and the third metal layer 77 may be formed on the one side portion and the other side portion of the prescribed surface of the substrate holder 40D by electroless gold (Au) plating. Alternatively, the second metal layer 76 and the third metal layer 77 may be formed integrally with the first metal layer 75 in the step shown in FIG. 25C so as to form a single layer together.

Then, in the same manner as in the step shown in FIG. 12, plural (in the example of FIG. 22, four) members are prepared in each of which a light emitting element 80 is mounted on one end portion of one surface of a substrate 50 via a bonding material 70 and a bonding material 30 is formed on the light emitting element 80. One substrate 50 which is not mounted with a light emitting element 80 is also prepared. These substrates 50 are inserted into the respective grooves 42y and bonded to the inner walls of the grooves 42y by the metal layer 75c, and each light emitting element 80 is bonded to the adjacent substrate 50 by the bonding material 30. Thus, a light emitting device 10D is completed.

An alternative step is as follows. Each of four light emitting elements 80 is bonded to adjacent one of four substrates 50 via the bonding material 30. The light emitting element 80 that is not sandwiched between the respective substrates 50 is bonded, by the bonding material 30, to the substrate 50 which is not mounted with a light emitting element 80. Then, the substrates 50 are inserted into the respective grooves 42y simultaneously and bonded to the inner walls of the grooves 42y by the metal layer 75c.

As mentioned in the second embodiment, the substrate holder 40D may be made of ceramic instead of silicon. In this case, the grooves 42y can be formed by dicing, for example. Since ceramic is an insulating material, it is not necessary to form the insulating film 43.

The same advantages obtained by the first embodiment can be also obtained by using the above-described substrate holder 40D in which the plurality of elongated (slit-shape) grooves 42y are arranged at the prescribed pitch in the stacking direction of the substrates 50.

In the example of FIG. 24, heat generated by each light emitting element is transmitted to the wiring board 100 via the associated substrates 50 and the substrate holder 40D and dissipated through the wiring board 100. Since each substrate 50 is in contact with the entire inner wall surfaces of the corresponding groove 42y, heat can be transmitted efficiently from each substrate 50 to the substrate holder 40D. As a result, the heat dissipation efficiency of the light emitting device 10D as a whole can be increased.

The same effect as that of the respective embodiments can be obtained even when a substrate holder made of, for example, ceramic or glass instead of silicon is used. Ceramic or glass can be processed using a micro-blaster or laser beams.

In the third embodiment, both sides of the respective grooves 42y are opened, but the embodiment is not limited thereto. For example, the respective grooves 42y might be formed such that an opening is formed only in substrate insertion side of the substrate holder 40D while no opening is formed in both sides of the substrate holder 40D.

While certain embodiments have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the sprit of the invention. The accompanying claims and their equivalents are intended to cover such forms or modifications as would fall within the scope and sprit of the invention.

What is claimed is:

1. A light emitting device comprising:
a first light emitting element mounting unit comprising:
a first substrate made of a conductive material and comprising a first surface and a second surface opposite to the first surface;
a first light emitting element configured to emit light and mounted on the first surface of the first substrate; and
a first substrate holder which supports the first substrate and comprises:
a first column which faces a side surface of the first substrate and extends in a thickness direction of the first light emitting element and the first substrate; and a first protrusion which extends from the first column toward the first light emitting element and which is bonded to the first surface of the first substrate;

a second light emitting element mounting unit comprising:
- a second substrate made of a conductive material and comprising a first surface and a second surface opposite to the first surface;
- a second light emitting element configured to emit light and mounted on the first surface of the second substrate; and
- a second substrate holder which supports the second substrate and comprises:
  - a second column which faces a side surface of the second substrate and extends in a thickness direction of the second light emitting element and the second substrate; and
  - a second protrusion which extends from the second column toward the second light emitting element and which is bonded to the first surface of the second substrate, wherein the second light emitting element mounting unit is stacked on the first light emitting element mounting unit such that the second column of the second substrate holder is bonded to the first column of the first substrate holder and the first light emitting element is bonded to the second surface of the second substrate via a first bonding material.

2. The light emitting device of claim 1, wherein the first protrusion is bonded to the first surface of the first substrate via a first adhesive material, and the second protrusion is bonded to the first surface of the second substrate via a second adhesive material.

3. The light emitting device of claim 1, wherein the first and second substrate holders are formed in a U-shape when viewed from a top.

4. The light emitting device of claim 1, wherein the first light emitting element is bonded to the first surface of the first substrate via a second bonding material, and
   the second light emitting element is bonded to the first surface of the second substrate via a third bonding material.

5. The light emitting device of claim 1, wherein each of the first and second substrates has a protruding region that extends from each of the first and second substrate holders, when viewed from a top.

6. The light emitting device of claim 1, wherein a first lens is disposed on an optical path of light emitted from the first light emitting element, and
   a second lens is disposed on an optical path of light emitted from the second light emitting element,
   wherein a side surface of the first substrate, which is opposite to a side surface of the first substrate facing the first lens, is electrically connected to a wiring substrate via a fourth bonding material, and
   wherein a side surface of the second substrate, which is opposite to a side surface of the second substrate facing the second lens, is electrically connected to the wiring substrate via a fifth bonding material.

7. The light emitting device of claim 1, wherein
   the second column of the second substrate holder is bonded to the first column of the first substrate holder via an insulating film.

8. The light emitting device of claim 1, wherein
   the first light emitting element and the second light emitting element are configured to emit light at the same time, when current is supplied from the first substrate to the second light emitting element in the thickness direction.

9. The light emitting device of claim 1, wherein each of the first and second substrate holders is made of silicon, ceramic, or glass.

* * * * *